United States Patent
Joo et al.

(10) Patent No.: US 7,839,698 B2
(45) Date of Patent: Nov. 23, 2010

(54) SEMICONDUCTOR MEMORY DEVICE OF CONTROLLING BIT LINE SENSE AMPLIFIER

(75) Inventors: Jong-Doo Joo, Seongnam-si (KR); Cheol-Ha Lee, Suwon-si (KR); Jung-Han Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 346 days.

(21) Appl. No.: 12/070,655

(22) Filed: Feb. 20, 2008

(65) Prior Publication Data

US 2008/0291756 A1    Nov. 27, 2008

(30) Foreign Application Priority Data

Feb. 23, 2007    (KR) .................. 10-2007-0018483

(51) Int. Cl.
 *G11C 7/10* (2006.01)
(52) U.S. Cl. .................. 365/189.05; 365/208
(58) Field of Classification Search ............ 365/189.05, 365/208
See application file for complete search history.

(56) References Cited

U.S. PATENT DOCUMENTS

| | | | |
|---|---|---|---|
| 5,930,194 A * | 7/1999 | Yamagata et al. ...... | 365/230.03 |
| 6,351,423 B2 * | 2/2002 | Ooishi ................. | 365/207 |
| 6,418,067 B1 * | 7/2002 | Watanabe et al. ........ | 365/200 |
| 6,434,661 B1 * | 8/2002 | Konishi et al. ......... | 365/189.05 |
| 6,847,564 B2 | 1/2005 | Fukuda | |
| 7,064,993 B2 * | 6/2006 | Gyohten et al. ........ | 365/189.18 |
| 2004/0213064 A1 * | 10/2004 | Gyohten et al. ......... | 365/205 |

FOREIGN PATENT DOCUMENTS

| | | |
|---|---|---|
| JP | 2004-310814 | 11/2004 |
| KR | 1998-0076381 | 11/1998 |
| KR | 1020000022612 A | 4/2000 |
| KR | 1020050036226 A | 4/2005 |

* cited by examiner

*Primary Examiner*—Tuan T. Nguyen
(74) *Attorney, Agent, or Firm*—Mills & Onello, LLP

(57) ABSTRACT

A semiconductor memory device includes a memory core and an input/output circuit. The memory core amplifies a signal of a memory cell to output the amplified signal through an input/output line pair in a read mode, receives a signal of the input/output line pair to store in the memory cell in a write mode, and electrically separates a bit line pair from the input/output line pair in response to a read column selection signal, a write column selection signal and a first data masking signal. The input/output circuit buffers and provided a signal of the input/output line pair to input/output pins, receives input data from the input/output pins, and buffers the received input data to provide the buffered input data to the input/output line pair. Thus, the semiconductor device can perform a fast data writing operation.

9 Claims, 8 Drawing Sheets

SEMICONDUCTOR MEMORY DEVICE OF CONTROLLING BIT LINE SENSE AMPLIFIER

CROSS-REFERENCE TO RELATED APPLICATIONS

This application claims priority under 35 USC §119 to Korean Patent Application No. 10-2007-0018483, filed on Feb. 23, 2007 in the Korean Intellectual Property Office (KIPO), the disclosure of which is incorporated herein in its entirety by reference.

BACKGROUND OF THE INVENTION

1. Field of the Invention

The present invention relates to a semiconductor memory device, and more particularly to a semiconductor memory device having a reduced writing time.

2. Description of the Related Art

Generally, a dynamic random access memory (DRAM) has a longer access time than a static random access memory (SRAM). Thus, the DRAM is generally used to store massive data for its low cost and low power consumption. The SRAM has a short access time, but has demerits of high cost and high power consumption.

Recently, according to development of a system-on-chip (SOC) technology, various circuits, such as a logic circuit and a linear circuit, are included in one semiconductor chip, and a DRAM embedded in the SOC is referred to as an embedded DRAM (EDRAM). The EDRAM has advantages of short access time, low cost and low power consumption. The EDRAM also can be referred to as a Pseudo SRAM (PSRAM) because the EDRAM performs interface operations such that the EDRAM can operate similarly to the SRAM in relation to external circuits.

FIG. 1 is a circuit diagram illustrating a bit line sense amplifier included in the conventional semiconductor memory device.

Referring to FIG. 1, the bit line sense amplifier includes an n-type sense amplifier 40 and a p-type sense amplifier 20 for amplifying a voltage level of data, separation circuits 60 and 70 for separating signals of a memory cell (not shown) from the sense amplifiers 20 and 40, equalization circuits 10 and 50 for pre-charging a bit line BL and a complementary bit line BLB and equalizing a voltage of a bit line BL and a voltage of a complementary bit line BLB, and a column selection circuit 30.

The column selection circuit 30 provides voltage signals of the bit line BL and the complementary bit line BLB to an input/output line pair IOL and IOLB when a column selection signal CSL is enabled in a read mode. The column selection circuit 30 provides voltage signals of the input/output line pair IOL and IOLB to the bit line BL and the complementary bit line BLB when the column selection signal CSL is enabled in a write mode.

Generally, data stored in the memory cell may need to be sensed and restored in writing the data in the memory cell. A data restoring time needs to be reduced in the write mode, particularly in a case of an early write semiconductor memory device. The input/output line pair 10 and IOB is electrically coupled to the bit line pair BL and BLB in the read mode or in a data masking operation mode. Thus, the bit line sense amplifier can have longer restoring time due to a load effect caused by the input/output line pair IO and IOB. The data masking operation means an operation for masking data for preventing the data from being written into some portions of memory cell blocks in a memory cell array. Long restoring time due to the load effect in the masking operation causes an unstable operation and decreases an operation speed of the semiconductor memory device.

Thus, a semiconductor memory device having reduced restoring time of the bit line in the data masking operation mode is required.

SUMMARY OF THE INVENTION

In accordance with some aspects of the present invention, provided is a semiconductor memory device having reduced restoring time of the bit line in the data masking operation mode.

In accordance with other aspects of the present invention, provided is a bit line sense amplifier having reduced restoring time of the bit line in the data masking operation mode.

In accordance with still other aspects of the present invention, provided is a method of controlling a bit line sense amplifier for reduced restoring time of the bit line in the data masking operation mode.

In accordance with one aspect of the present invention, a semiconductor memory device includes a memory core and an input/output circuit. The memory core is configured to amplify a signal from a memory cell to output the amplified signal through an input/output line pair in a read mode, receive a signal of the input/output line pair to be stored in the memory cell in a write mode, and electrically separate a bit line pair from the input/output line pair in response to a read column selection signal, a write column selection signal, and a first data masking signal. The input/output circuit is configured to buffer and provide the amplified signal of the input/output line pair to input/output pins, receive input data from the input/output pins, and buffer the received input data to provide the buffered input data to the input/output line pair.

The semiconductor memory device can further include a shift control circuit configured to shift bits of a second data masking signal to generate the first data masking signal, and provide the first data masking signal to the memory core.

The shift control circuit can be configured to receive the buffered input data and shift bits of the buffered input data to be provided to the memory core.

The memory core can include a bit line, a complementary bit line, an input/output line, a complementary input/output line, a bit line sense amplifier, a read column selection circuit, and a write column selection circuit. The bit line sense amplifier can lo be configured to amplify a voltage signal of the bit line to generate a first amplified signal, and provide the first amplified signal to the bit line. In addition, the bit line sense amplifier can be configured to amplify a voltage signal of the complementary bit line to generate a second amplified signal, and provide the second amplified signal to the complementary bit line. The read column selection circuit can be configured to output the first amplified signal and the second amplified signal to the input/output line and the complementary input/output line, respectively, in response to the read column selection signal, and to electrically separate the bit line pair and the input/output line pair in response to the read column selection signal. The write column selection circuit can be configured to provide signals of input/output line pair to the bit line pair in response to the write column selection signal, and electrically separate the bit line pair from the input/output line pair in response to the write column selection signal and the first data masking signal.

The semiconductor memory device can include a first memory cell and a second memory cell. The first memory cell can be coupled to the bit line. The first memory cell can be configured to operate in response to a first word line signal. The second memory cell can be coupled to the complementary bit line. The second memory cell can be configured to operate in response to a second word line signal.

The read column selection circuit can include a first metal oxide semiconductor (MOS) transistor, a second MOS transistor, a third MOS transistor, and a fourth MOS transistor. The first MOS transistor can have a gate terminal coupled to the bit line and a source terminal coupled to a ground voltage. The second MOS transistor can have a gate terminal configured to receive the read column selection signal, a source terminal coupled to a drain terminal of the first MOS transistor and a drain terminal coupled to the input/output line. The third MOS transistor can have a gate terminal coupled to the complementary bit line and a source terminal coupled to the ground voltage. The fourth MOS transistor can have a gate terminal configured to receive the read column selection signal, a source terminal coupled to a drain terminal of the third MOS transistor, and a drain terminal coupled to the complementary input/output line.

The write column selection circuit can include a first MOS transistor, a second MOS transistor, a third MOS transistor, and a fourth MOS transistor. The first MOS transistor can have a gate terminal configured to receive the write column selection signal and a source terminal coupled to the input/output line. The second MOS transistor can have a gate terminal configured to receive the first data masking signal, a source terminal coupled to a drain terminal of the first MOS transistor, and a drain terminal coupled to the bit line. The third MOS transistor can have a gate terminal configured to receive the write column selection signal, and a source terminal coupled to the complementary input/output line. The fourth MOS transistor can have a gate terminal configured to receive the first data masking signal, a source terminal coupled to a drain terminal of the third MOS transistor, and a drain terminal coupled to the complementary bit line.

The write column selection circuit can include a first MOS transistor, a second MOS transistor, a third MOS transistor, and a fourth MOS transistor. The first MOS transistor can have a gate terminal configured to receive the first data masking signal, and a source terminal coupled to the input/output line. The second MOS transistor can have a gate terminal configured to receive the write column selection signal, a source terminal coupled to a drain terminal of the first MOS transistor, and a drain terminal coupled to the bit line. The third MOS transistor can have a gate terminal configured to receive the first data masking signal, and a source terminal coupled to the complementary input/output line. The fourth MOS transistor can have a gate terminal configured to receive the write column selection signal, a source terminal coupled to a drain terminal of the third MOS transistor, and a drain terminal coupled to the complementary bit line.

The memory core can include a bit line, a complementary bit line, an input/output line, a complementary input/output line, a bit line sense amplifier, a read column selection circuit, a write column selection circuit, and a data masking control circuit. The bit line sense amplifier can be configured to amplify a voltage signal of the bit line to generate a first amplified signal, provide the first amplified signal to the bit line, amplify a voltage signal of the complementary bit line to generate a second amplified signal, and provide the second amplified signal to the complementary bit line. The read column selection can be configured to output the first amplified signal and the second amplified signal to the input/output line and the complementary input/output line, respectively, in response to the read column selection signal, and electrically separate the bit line pair from the input/output line pair in response to the column selection signal. The write column selection circuit can be configured to provide signals of input/output line pair to the bit line pair in response to the write column selection signal, and electrically separate the bit line pair from the input/output line pair in response to the write column selection signal. The data masking control circuit can electrically separate the bit line pair from the input/output line pair in response to the first data masking signal.

In accordance with another aspect of the present invention, a bit line sense amplifier circuit includes a bit line pair, an input/output line pair, a bit line sense amplifier, a read column selection circuit, and a write column selection circuit. The bit line pair can include a bit line and a complementary bit line. The input/output line pair can include an input/output line and a complementary input/output line. The bit line sense amplifier can be configured to amplify a voltage signal of the bit line to generate a first amplified signal, and provide the first amplified signal to the bit line. In addition, the bit line sense amplifier can be configured to amplify a voltage signal of the complementary bit line to generate a second amplified signal, and provide the second amplified signal to the complementary bit line. The read column selection circuit can output the first amplified signal and the second amplified signal to the input/output line and the complementary input/output line, respectively, in response to a read column selection signal, and electrically separate the bit line pair from the input/output line pair in response to the read column selection signal. The write column selection circuit can be configured to provide signals of the input/output line pair to the bit line pair in response to a write selection signal, and electrically separate the bit line pair from the input/output line pair in response to the write selection signal and the data masking signal.

The read column selection circuit can include a first MOS transistor, a second. MOS transistor, a third MOS transistor, and a fourth MOS transistor. The first MOS transistor can have a gate terminal coupled to the bit line and a source terminal coupled to a ground voltage. The second MOS transistor can have a gate terminal configured to receive the read column selection signal, a source terminal coupled to a drain terminal of the first MOS transistor and a drain terminal coupled to the input/output line. The third MOS transistor can have a gate terminal coupled to the complementary bit line and a source terminal coupled to the ground voltage. The fourth MOS transistor can have a gate terminal configured to receive the read column selection signal, a source terminal coupled to a drain terminal of the third MOS transistor, and a drain terminal coupled to the complementary input/output line.

The write column selection circuit can include a first MOS transistor, a second MOS transistor, a third MOS transistor, and a fourth MOS transistor. The first MOS transistor can have a gate terminal configured to receive the write column selection i5 signal and a source terminal coupled to the input/output line. The second MOS transistor can have a gate terminal configured to receive the data masking signal, a source terminal coupled to a drain terminal of the first MOS transistor, and a drain terminal coupled to the bit line. The third MOS transistor can have a gate terminal configured to receive the write column selection signal, and a source terminal coupled to the complementary input/output line. The fourth MOS transistor can have a gate terminal receive the data masking signal, a source terminal coupled to a drain terminal of the third MOS transistor, and a drain terminal coupled to the complementary bit line.

The write column selection circuit can include a first MOS transistor, a second MOS transistor, a third MOS transistor, and a fourth MOS transistor. The first MOS transistor can have a gate terminal configured to receive the data masking signal, and a source terminal coupled to the input/output line. The second MOS transistor can have a gate terminal configured to receive the write column selection signal, a source terminal coupled to a drain terminal of the first MOS transistor, and a drain terminal coupled to the bit line. The third MOS transistor can have a gate terminal configured to receive the data masking signal, and a source terminal coupled to the complementary input/output line. The fourth MOS transistor can have a gate terminal configured to receive the write column selection signal, a source terminal coupled to a drain terminal of the third MOS transistor, and a drain terminal coupled to the complementary bit line.

In accordance with still another aspect of the present invention, a method of controlling a bit line sense amplifier includes generating amplified signals by amplifying voltage signals of a bit line pair to provide the amplified signals to the bit line pair, outputting the amplified signals to an input/output line pair in response to a read column selection signal in a read mode, providing signals of the input/output line pair to the bit line pair in response to the write column selection signal in a write mode, and electrically separating the bit line pair from the input/output line pair in response to the write selection signal and a data masking signal in a data masking operation mode.

Therefore, the semiconductor memory device according to various aspects of the present invention can perform a fast data writing operation.

DESCRIPTION OF THE EMBODIMENTS

Figure 1:
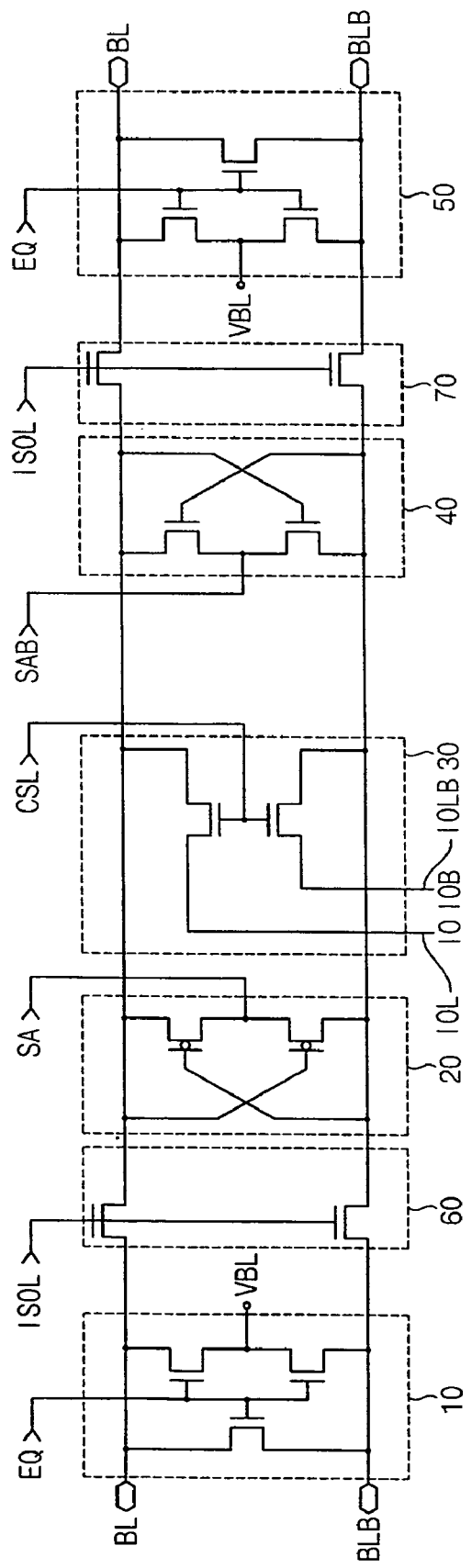
FIG. 1 is a circuit diagram illustrating a bit line sense amplifier included in the conventional semiconductor memory device.

Embodiments in accordance with aspects of the present invention now will be described more fully with reference to the accompanying drawings. This invention can, however, be embodied in many different forms and should not be construed as limited to the embodiments set forth herein. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 2:
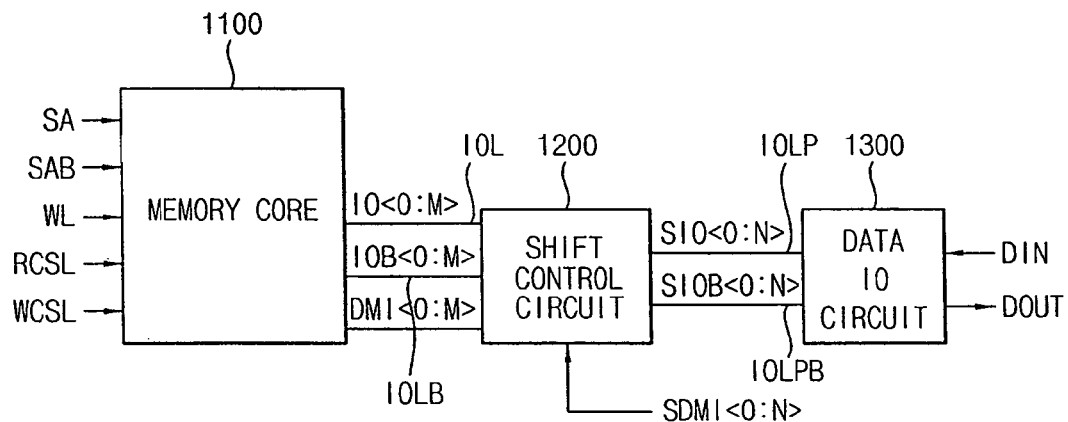
FIG. 2 is a block diagram illustrating an example embodiment of a semiconductor memory device having a data masking function according to an aspect of the present invention.

FIG. 2 is a block diagram illustrating an example embodiment of a semiconductor memory device having a data masking function according to an aspect of the present invention.

Referring to FIG. 2, the semiconductor memory device 1000 includes a memory core 1100, a shift control circuit 1200, and a data input/output circuit 1300.

The memory core 1100 amplifies a signal from a memory cell to output the amplified signal to a first input/output line pair IOL and IOLB in a read mode. The memory core 1100 receives a signal of the first input/output line pair IOL and IOLB to store the received signal in the memory cell in a write mode. The memory core 1100 electrically separates a bit line pair from the first input/output line pair IOL and IOLB in response to a read column selection signal RCSL, a write column selection signal WCSL, and a first data masking signal DMI<0:M>.

The input/output circuit 1300 buffers signals of a second input/output line pair IOLP and IOLPB to generate output data DOUT. The input/output circuit 1300 receives input data DIN, and buffers the received input data DIN and generates a second input data pair SIO<0:N> and SIOB<0:N> to provide to the second input/output line pair IOLP and IOLPB.

The shift control circuit 1200 receives a second data masking signal SDMI<0:N> and shifts an order of bits of the second data masking signal SDMI<0:N> to generate the first data masking signal DMI<0:M>. The shift control circuit 1200 provides the first data masking signal DMI<0:M> to the memory core 1100. The shift control circuit 1200 receives the second input data pair SIO<0:N> and SIOB<0:N> and shifts an order of bits of the second input data pair SIO<0:N> and SIOB<0:N> to generate a first input data pair IO<0:M> and IOB<0:M>. The shift control circuit 1200 provides the first input data pair IO<0:M> and IOB<0:M> to the memory core 1100.

Figure 3:
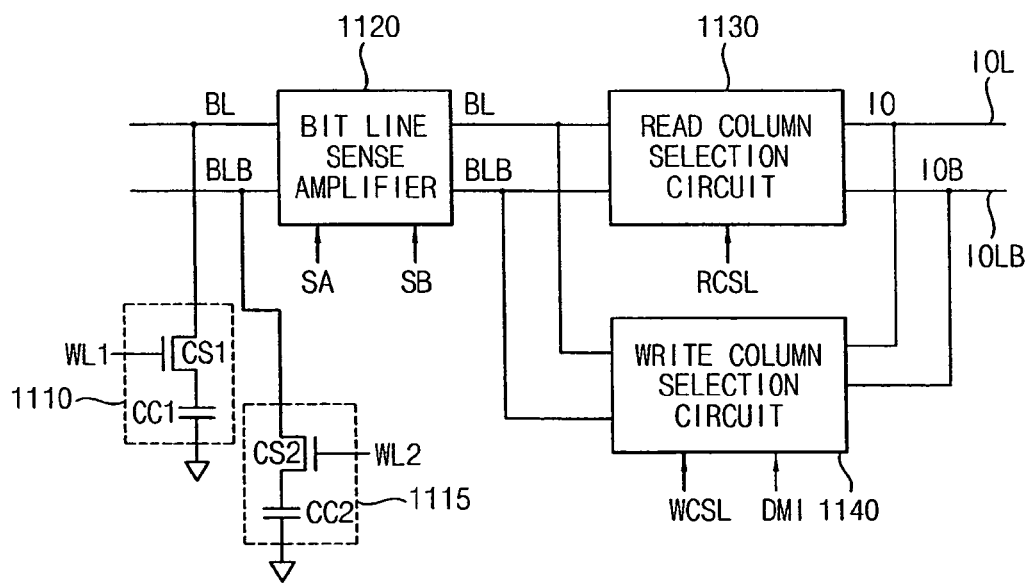
FIG. 3 is a circuit diagram illustrating an example embodiment of a memory core included in the semiconductor memory device in FIG. 2 according to an aspect of the present invention.

FIG. 3 is a circuit diagram illustrating an example embodiment of a memory core included in the semiconductor memory device in FIG. 2 according to an aspect of the present invention.

Referring to FIG. 3, the memory core 1100a includes a bit line BL coupled to a first memory cell 1110, a complementary bit line BLB coupled to a second memory cell 1115, an input/output line IOL, a complementary bit line IOLB, a bit line sense amplifier 1120, a read column selection circuit 1130, and a write column selection circuit 1140.

The bit line sense amplifier 1120 amplifies a voltage signal of the bit line BL to generate a first amplified signal in response to a first amplifier control voltage SA and a second amplifier control voltage SB. The bit line sense amplifier 1120 provides the first amplified signal to the bit line BL. Additionally, the bit line sense amplifier 1120 amplifies a voltage signal of the complementary bit line BLB to generate a second amplified signal in response to the first amplifier control voltage SA and the second amplifier control voltage SB. The bit line sense amplifier 1120 provides the second amplified signal to the complementary bit line BLB.

The read column selection circuit 1130 outputs the first amplified signal and the second amplified signal to the input/output line IOL and the complementary input/output line IOLB, respectively, in response to a read column selection signal RCSL. Additionally, the read column selection circuit 1130 electrically separates the bit line pair BL and BLB from the first input line pair IOL and IOLB.

The write column selection circuit 1140 provides signals of the first input/output line pair IOL and IOLB to the bit line pair BL and BLB in response to a write column selection signal WCSL. Additionally, the write column selection circuit 1140 electrically separates the bit line pair BL and BLB from the first input/output line pair IOL and IOLB.

The first memory cell 1110 coupled to the bit line BL operates in response to a first word line signal WL1. The second memory cell 1115 coupled to the complementary bit line BLB operates in response to a second word line signal WL2.

Figure 4:
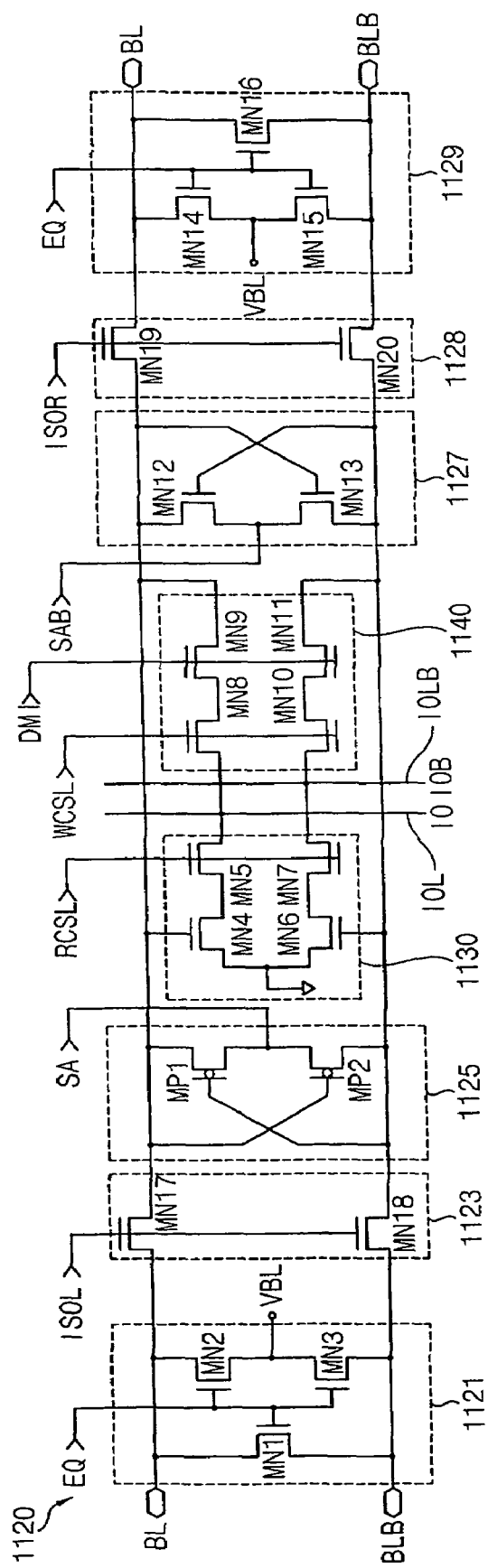
FIG. 4 is a circuit diagram illustrating an example embodiment of respective blocks included in the memory core in FIG. 3.

FIG. 4 is a circuit diagram illustrating an example embodiment of respective blocks included in the memory core in FIG. 3. The first and second memory cells 1110 and 1115 in FIG. 3 are omitted in FIG. 4.

Referring to FIG. 4, the bit line sense amplifier 1120 includes a first sense lo amplifier 1125 of a p-type and a second sense amplifier 1127 of an n-type for amplifying data signals from the memory cells (not shown) via the bit lines BL and BLB, first and second separation circuits 1123 and 1128 for separating signals of the memory cells coupled to the bit line BL and the complementary bit line BLB from the sense amplifiers 1127 and 1125, and first and second equalization circuits 1121 and 1129.

The first sense amplifier 1125 includes a first p-type metal oxide semiconductor (PMOS) transistor MP1 and a second PMOS transistor MP2. The first sense amplifier 1125 amplifies a voltage signal of the bit line BL or a voltage signal of the complementary bit line BLB up to a voltage level of the first amplifier control voltage SA. The second sense amplifier 1127 includes a first n-type metal oxide semiconductor (NMOS) transistor MN19 and a second NMOS transistor MN20. The second sense amplifier 1127 amplifies the voltage signal of the bit line BL or the voltage signal of the complementary bit line BLB up to a voltage level of the second amplifier control voltage SAB.

The first equalization circuit 1121 includes a third NMOS transistor MN1, a fourth NMOS transistor MN2, and a fifth transistor MN3. The first equalization circuit 1121 pre-charges the bit line BL and the complementary bit line BLB with a pre-charge voltage VBL and equalizes voltages of the bit line BL and the complementary bit line BLB. The second equalization circuit 1129 includes a sixth NMOS transistor MN14, a seventh NMOS transistor MN15, and an eighth transistor MN16. The second equalization circuit 1129 pre-charges the bit line BL and the complementary bit line BLB with the pre-charge voltage VBL and equalizes the voltages of the bit line BL and the complementary bit line BLB.

The first separation circuit 1123 includes a ninth NMOS transistor MN17 and a tenth NMOS transistor MN18. The first separation circuit 1123 electrically separates the first equalization circuit 1121 from the first sense amplifier 1125 in response to a first separation signal ISOL. The second separation circuit 1128 includes an eleventh NMOS transistor MN19 and a twelfth NMOS transistor MN20. The second separation circuit 1128 electrically separates the second equalization circuit 1129 from the second sense amplifier 1127 in response to a second separation signal ISOR.

The read column selection circuit 1130 includes a thirteenth NMOS transistor MN4, a fourteenth NMOS transistor MN5, a fifteenth NMOS transistor MN6, and a sixteenth NMOS transistor MN7.

The thirteenth NMOS transistor MN4 has a gate terminal coupled to the bit line BL and a source terminal coupled to a ground voltage. The fourteenth NMOS transistor MN5 has a gate terminal receiving the read column selection signal RCSL, a source terminal coupled to a drain terminal of the thirteenth NMOS transistor MN4, and a drain terminal coupled to the input/output line IOL. The fifteenth NMOS transistor MN5 has a gate terminal coupled to the complementary bit line BLB, and a source terminal coupled to the ground voltage. The sixteenth NMOS transistor MN7 has a gate terminal receiving the read column selection signal RCSL, a source terminal coupled to a drain terminal of the fifteenth NMOS transistor, and a drain terminal coupled to the complementary input/output line IOLB.

The write column selection circuit 1140 includes a seventeenth NMOS transistor MN8, an eighteenth NMOS transistor MN9, a nineteenth NMOS transistor MN10, and a twentieth NMOS transistor MN11.

The seventeenth NMOS transistor MN8 has a gate terminal receiving the write column selection signal WCSL, and a source terminal coupled to the input/output line IOL. The eighteenth NMOS transistor has a gate terminal receiving the first data masking signal DMI, a source terminal coupled to a drain terminal of the seventh NMOS transistor, and a drain terminal coupled to the bit line BL. The nineteenth NMOS transistor MN10 has a gate terminal receiving the write column selection signal WCSL, and a source terminal coupled to the complementary input/output line IOLB. The twentieth NMOS transistor MN11 has a gate terminal receiving the first data masking signal DMI, a source terminal coupled to a drain terminal of the nineteenth transistor MN10, and a drain terminal coupled to the complementary bit line BLB.

Figure 5:
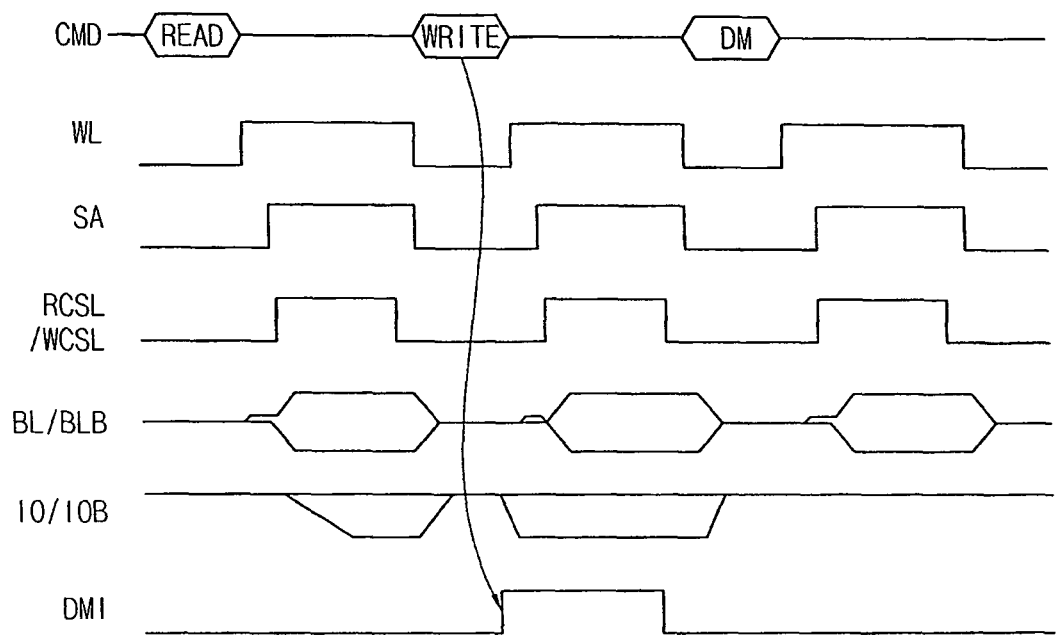
FIG. 5 is a timing diagram illustrating an operation of the memory core in FIG. 4.

FIG. 5 is a timing diagram illustrating an embodiment of an operation of the memory core in FIG. 4. In FIG. 5, CMD represents a command, WL represents a word line signal, SA represents an amplifier control signal provided to the first sense amplifier 1125, RCSL and WCSL represent the read column selection signal and the write column selection signal, respectively, BL and BLB represent the voltages of the bit line and the complementary bit line, respectively, IO and IOB represent the voltages of the input/output line and the complementary bit line, respectively, and DMI represents one bit of the first data masking signal. Referring to FIG. 5, one bit of the first data masking signal DMI is enabled in response to a write command signal WRITE.

Figure 6:
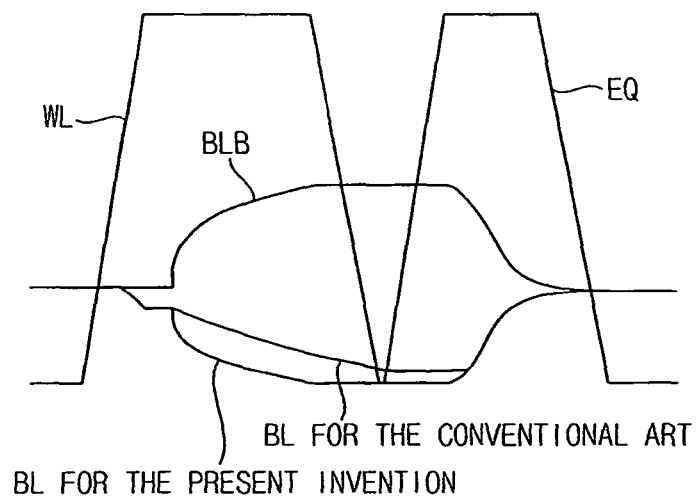
FIG. 6 is a waveform diagram illustrating comparative performances of the memory core in FIG. 4 and the memory core including the conventional bit line sense amplifier in FIG. 1.

FIG. 6 is a waveform diagram illustrating performances of the memory core in FIG. 4 and the memory core including the conventional bit line sense amplifier in FIG. 1.

Hereinafter, operations of the semiconductor memory device according to an example embodiment of the present invention will be described in detail with reference to FIGS. 2 through 6.

Referring to FIG. 2, the shift control circuit 1200 receives the buffered second input data pair SIO<0:N> and SIOB<0:N> and shift an order of bits of the buffered second input data pair SIO<0:N> and SIOB<0:N> to provide the memory core 1100. When the memory core 1100 has a defective cell block, the shift control circuit 1100 shifts an order of bits of the second input data pair SIO<0:N> and SIOB<0:N> to provide the shifted first input data pair IO<0:M> and IOB<0:M>to the memory core 1100. Additionally, the shift control circuit 1200 shifts an order of a second masking signal SDMI<0:N> to provide a shifted first data masking signal DMI<0:M>.

Referring to FIG. 3, the write column selection circuit 1130 electrically separates the bit line pair BL and BLB from the first input/output line pair IOL and IOLB, or electrically connects the bit line pair BL and BLB with the first input/output line pair IOL and IOLB.

The first data masking signal DMI corresponds to logic high state in the write mode, and corresponds to logic low state in a data masking operation mode. The first data masking signal DMI can correspond to logic high state or logic low state in the read mode.

The write column selection signal WCSL and the first data masking signal DMI correspond to logic high state in the write mode. A voltage signal of the input/output line IOL is provided to the bit line BL through the NMOS transistors MN8 and MN9 in the write mode. Additionally, a voltage signal of the complementary bit line IOLB is provided to the complementary BLB through the NMOS transistors MN10 and MN11.

In the data masking operation, the first data masking signal DMI corresponds to logic low state, and the NMOS transistors MN9 and MN11 are turned off. Thus, the bit line pair BL and BLB is electrically separated from the first input/output line pair IOL and IOLB. Therefore, a restoring operation can be performed without an influence of the masked memory cell blocks. Data writing time can be reduced by reducing a load lo effect caused by the electrically coupled input/output line pair IOL and IOLB in the data masking operation mode.

Referring to FIG. 5, the first data masking signal DMI is enabled in response to the write command signal WRITE. When the first data masking signal DMI is disabled, that is, when the data masking signal corresponds to logic low state, the semiconductor memory device performs a data masking operation. A time interval for fully developing voltages on the bit line and the complementary bit line can be reduced because the bit line pair BL and BLB is electrically separated from the first input/output line pair IOL and IOLB in the data masking operation mode.

Referring to FIG. 6, in the conventional memory core, as illustrated in FIG. 1, the bit line requires a relatively long time to fall to 0V level in a restoring operation mode due to the load effect.

In the example embodiment illustrated in FIG. 2, a semiconductor device can perform a writing operation faster even though the writing operation can be performed after sufficiently restoring the bit line.

Figure 7:
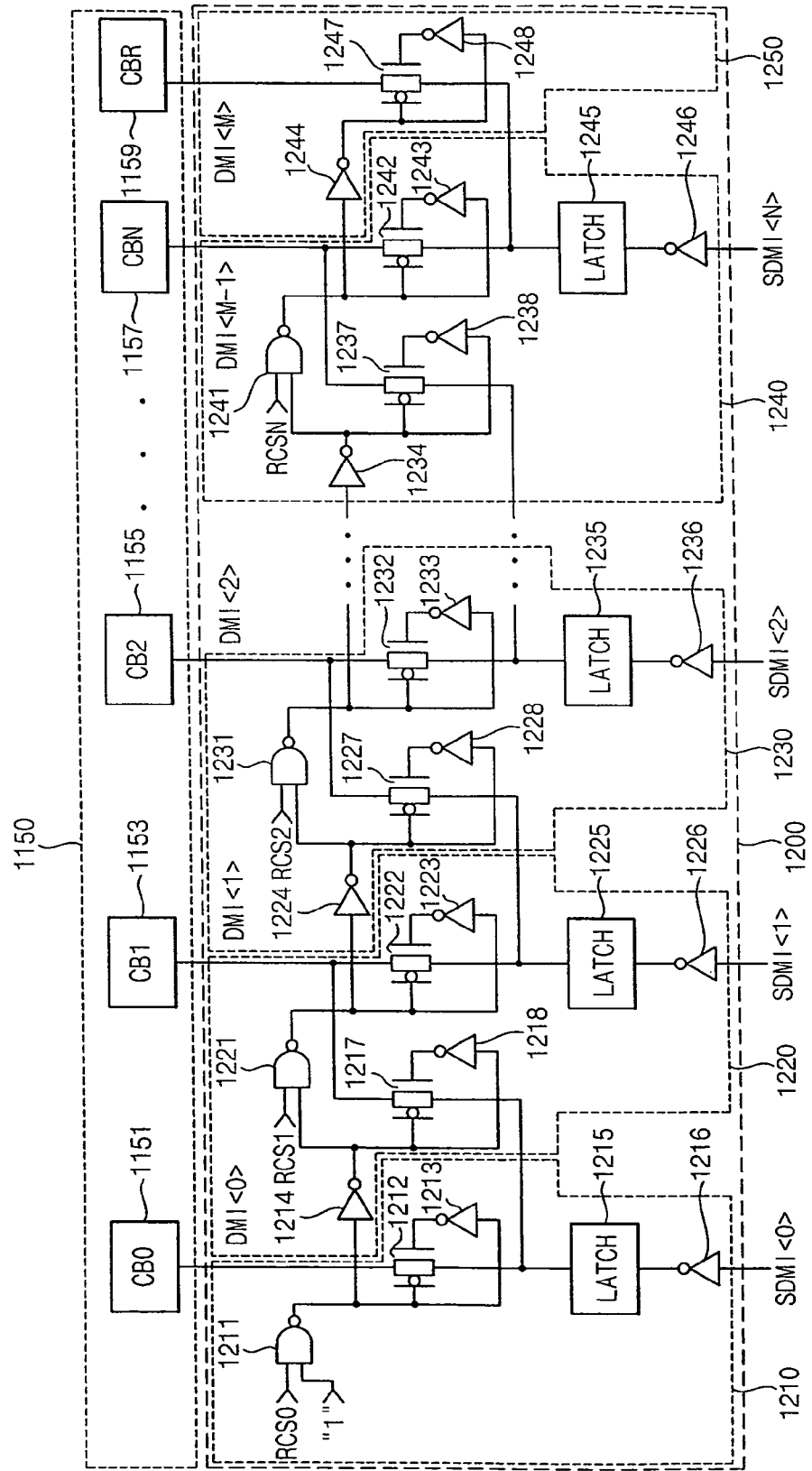
FIG. 7 is a circuit diagram illustrating an embodiment of the shift control circuit included in the semiconductor in FIG. 2.

FIG. 7 is a circuit diagram illustrating an embodiment of the shift control circuit 1200 included in the semiconductor 100 in FIG. 2. The memory core 1150 in FIG. 7 corresponds to the memory core 1100 in FIG. 2. Memory cell blocks CB0 through CBN and CBR are also illustrated with the shift control circuit 1200 in FIG. 7.

Referring to FIG. 7, the shift control circuit 1200 includes a first circuit path 1210, a second circuit path 1220, a third circuit path 1330, an Mth circuit path 1240 and an (M+1)th circuit path 1250. M corresponds to N+1 in FIG. 7, where M and N are positive integers.

The first circuit path 1210 includes a first inverter 1216, a first latch 1215, a first transmission gate 1212, a second inverter 1213, and a first NAND gate 1211.

The first NAND gate 1211 performs a NAND operation on a first bit RCS0 of a first repair control signal and logic high value to generate a first bit of a second repair control signal. The first inverter 1216 inverts a first bit SDMI<0> of the second data masking signal. The first latch 1215 latches an output signal of the first inverter 1216 to generate a first latched masking signal. The second inverter 1213 inverts an output signal of the first NAND gate 1211. The first transmission gate 1212 provides the first latched masking signal to a first memory cell block 1151 in response to the first bit of the second repair control signal and the output signal of the second inverter 1213.

The second circuit path 1220 includes a third inverter 1214, a fourth inverter 1218, a second transmission gate 1217, a fifth inverter 1226, a second latch 1225, a sixth inverter 1223, a third transmission gate 1222, and a second NAND gate 1221.

The third inverter 1214 inverts the first bit of the second repair control signal. The fourth inverter 1218 inverts an output signal of the third inverter 1214. The second NAND gate 1221 performs the NAND operation on a second bit RCS1 of the first repair control signal and the output signal of the third inverter 1214 to generate a second bit of the second repair control signal. The second transmission gate 1217 provides a second latched masking signal to a second memory cell block 1153 in response to the output signal of the third inverter 1214 and an output signal of the fourth inverter 1218. The fifth inverter 1226 inverts a second bit SDMI<1> of the second data masking signal. The second latch 1225 latches an output signal of the first inverter 1226 to generate the second latched masking signal. The sixth inverter 1223 inverts an output signal of the second NAND gate 1221. The second transmission gate 1222 provides the second latched masking signal to the second memory cell block 1153 in response to the second lo bit of the second repair control signal and an output signal of the sixth inverter 1223.

The third circuit path 1230 includes a seventh inverter 1224, an eighth inverter 1228, a fourth transmission gate 1227, a ninth inverter 1236, a third latch 1235, a tenth inverter 1233, a fifth transmission gate 1232, and a third NAND gate 1231.

The seventh inverter 1224 inverts the second bit of the second repair control signal. The eighth inverter 1228 inverts an output signal of the seventh inverter 1224. The third NAND gate 1231 performs the NAND operation on a third bit RCS2 of the first repair control signal and the output signal of the seventh inverter 1224 to generate a third bit of the second repair control signal. The fourth transmission gate 1227 provides a third latched masking signal to a third memory block 1155 in response to the output signal of the seventh inverter 1224 and an output signal of the eighth inverter 1228. The ninth inverter 1236 inverts a third bit SDMI<2>of the second data masking signal. The third latch 1235 latches an output signal of the ninth inverter 1236 to generate the third latched masking signal. The tenth inverter 1233 inverts an output signal of the third NAND gate 1231. The fifth transmission gate 1232 provides the third latched masking signal to the third memory block 1155 in response to the third bit of the second repair control signal and an output signal of tenth inverter 1233.

The Mth circuit path 1240 includes an eleventh inverter 1234, a twelfth inverter 1238, a sixth transmission gate 1237, a thirteenth inverter 1246, a fourth latch 1245, a fourteenth inverter 1243, a seventh transmission gate 1242, and a fourth NAND gate 1241.

The eleventh inverter 1234 inverts an Nth bit of the second repair control signal. The twelfth inverter 1238 inverts an output signal of the eleventh inverter 1234. The fourth NAND gate 1241 performs the NAND operation on an (N+1)th bit RCSN of the first repair control signal and the output signal of a eleventh inverter 1234 to generate an (N+1)th bit of the second repair control signal. The sixth transmission gate 1237 provides a fourth latched masking signal to an (N+1)th memory cell block 1157 in response to the output signal of the eleventh inverter 1234 and an output signal of the twelfth inverter 1238. The thirteenth inverter 1246 inverts an (N+1)th bit SDMI<N> of the second data masking signal. The fourth latch 1245 latches an output signal of the thirteenth inverter 1246 to generate the fourth latched masking signal. The fourteenth inverter 1243 inverts an output signal of the fourth NAND gate 1241. The seventh transmission gate 1242 provides the fourth latched masking signal to the (N+1)th memory cell block 1157 in response to the (N+1)th bit of the second repair control signal and an output signal of the fourth inverter 1243.

An (M+1)th circuit path 1240 includes a fifteenth inverter 1244, a sixteenth inverter 1248, and an eighth transmission gate 1247.

The fifteenth inverter 1244 inverts the (N+1)th bit of the second repair control signal. The sixteenth inverter 1248 inverts an output signal of the fifteenth inverter 1244. The eighth transmission gate 1247 provides the fourth latched masking signal to an (N+2)th memory block 1159 in response to the output signal of the fifteenth inverter 1244 and an output signal of the sixteenth inverter 1248.

Hereinafter, operations of the shift control circuit 1200 in FIG. 7 will be described.

In FIG. 7, CBR represents a repair memory cell block. The first repair control signals RCS0 through RCSN are generated based on combinations of address signals. DMI<0:M> in FIG. 7 represents the first data masking signal generated by shifting the second data masking signal SDMI<0:M> with the circuit paths 1210 to 1250. For convenience of description, it is assumed that the second memory cell block 1153 is a defective cell block.

When the second memory cell block 1153 is a defective cell block in FIG. 7, the second bit RCS1 of the first repair control signal is disabled, and a first bit RCS0 and a third bit RCS2 through an (N+1)th bit of the first repair control signal are enabled.

When the first bit RCS0 of the first repair control signal corresponds to logic high state, the output signal of the second NAND gate 1221 corresponds to logic low state, and the first transmission gate 1212 is turned on. Thus, the first bit SDMI<0> of the second data masking signal is provided to the first memory cell block 1151.

When the second bit RCS1 of the first repair control signal corresponds to logic low state, the output signal of the second NAND gate 1221 corresponds to logic high state, and the third transmission gate 1222 is turned off. The second transmission gate 1217 is turned off because the output signal of the third inverter 1214 corresponds to logic high state. Thus, the second data masking signal is not provided to the defective second memory cell block 1153.

The output signal of the second NAND gate 1221 corresponds to logic high state, and the output signal of the seventh inverter 1224 corresponds to logic low state. Thus, the output signal of the third NAND gate 1231 corresponds to logic high state, and the fifth transmission gate 1232 is turned off. The fourth transmission gate 1227 is turned on, and thus the second bit SDMI<1> of the second data masking signal is provided to third memory cell block 1155 through the fourth transmission gate 1227.

In this manner, the shift control circuit 1200 included in the semiconductor device in FIG. 2 does not provide the second data masking signal to the defective second memory cell block 1153, and the semiconductor device in FIG. 2 shifts the second data masking signal by one bit to be provide to the memory cell block in the memory core. The (N+1)th bit SDMI<N> of the second data masking signal is provided to the repair cell CBR.

The shift control circuit 1200 included in the semiconductor device of FIG. 2 can change an order of the bits of the second input data pair SIO<0:N> and SIOB<0:N> as well as an order of the second data masking signal SDMI<0:N> to generate the second input data pair SIO<0:M> and SIOB<0:M>. A shifting operation of the bits of the second input data pair SIO<0:N> and SIOB<0:N> can be performed similarly to a shifting operation of the second data masking signal SDMI<0:N> as described with reference to FIG. 7.

Figure 8:
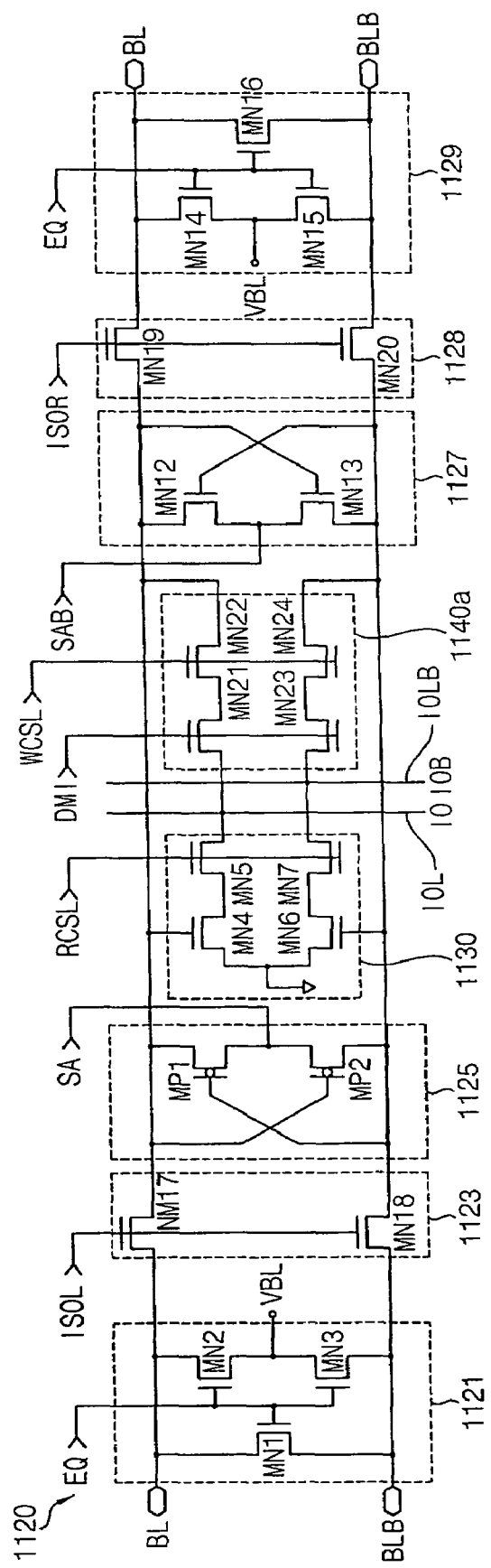
FIG. 8 is a circuit diagram illustrating another example embodiment of respective is blocks included in the memory core in FIG. 3.

FIG. 8 is a circuit diagram illustrating another example embodiment of respective blocks included in the memory core in FIG. 3. The memory core in FIG. 8 has a configuration similar to the memory core in FIG. 3, except for the addition of a write column selection circuit 1140a.

Referring to FIG. 8, the write column selection circuit 1140a includes a twenty-first NMOS transistor MN21, a twenty-second NMOS transistor MN22, a twenty-third NMOS transistor MN23, and a twenty-fourth NMOS transistor MN24.

The twenty-first NMOS transistor MN21 has a gate terminal receiving the first data masking signal DMI and a source terminal coupled to the input/output line IOL. The twenty-second NMOS transistor MN22 has a gate terminal receiving the write column selection signal WCSL, a source terminal coupled to a drain terminal of the twenty-first NMOS transistor MN21, and a drain terminal coupled to the bit line BL. The twenty-third NMOS transistor MN23 has a gate terminal receiving the first data masking signal DMI and a source terminal coupled to the complementary input/output line IOLB. The twenty-fourth NMOS transistor MN24 has a gate terminal receiving the write column selection signal WCSL, a source terminal coupled to a drain terminal of the twenty-third NMOS transistor MN23, and a drain terminal coupled to the complementary bit line BLB.

Figure 9:
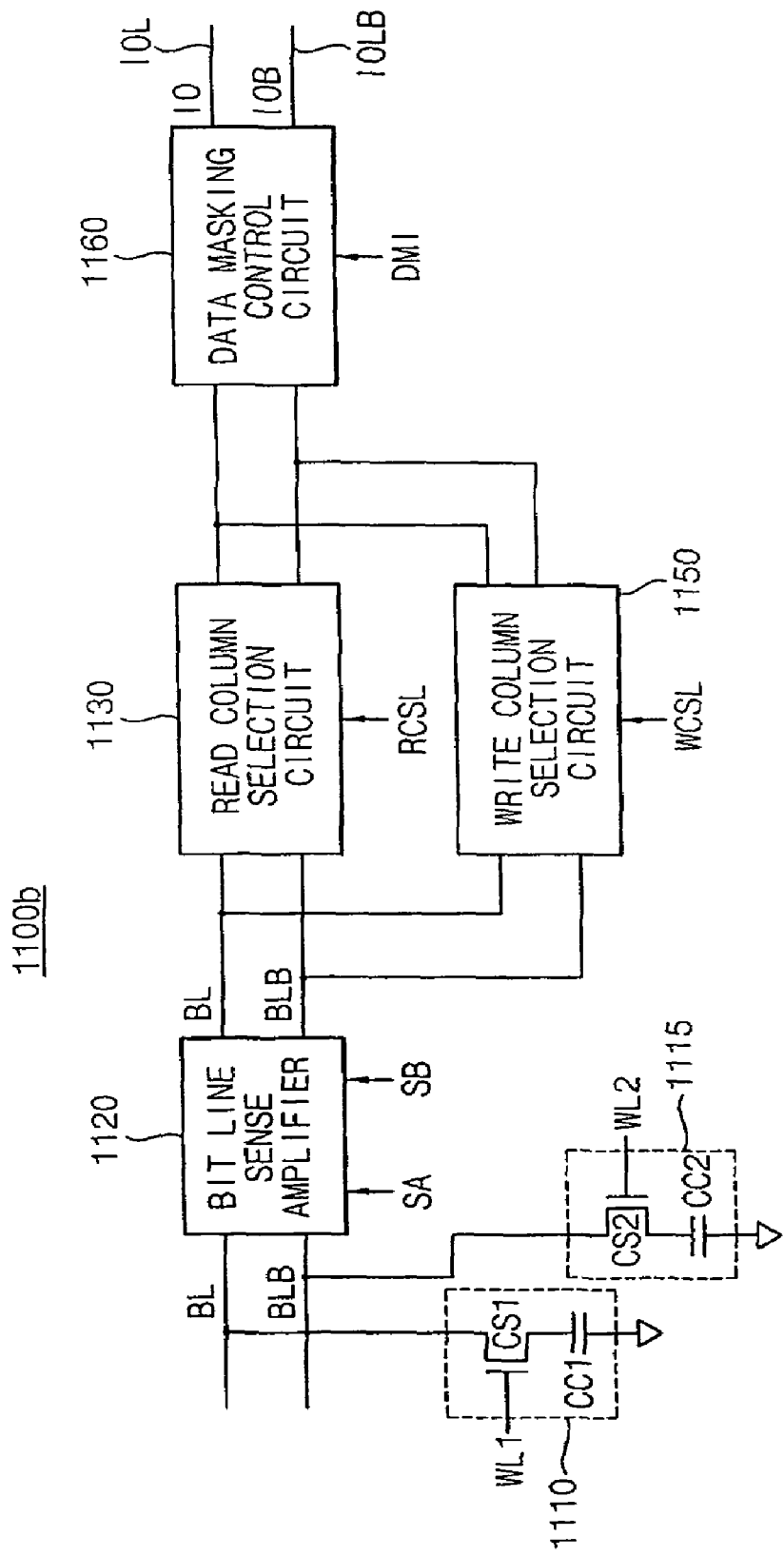
FIG. 9 is a circuit diagram illustrating another example embodiment of a memory core included in the semiconductor memory device in FIG. 2 according to aspects of the present invention.

FIG. 9 is a circuit diagram illustrating another example embodiment of a memory core included in the semiconductor memory device in FIG. 2 according to another aspect of the present invention.

Referring to FIG. 9, a memory core 1100b includes a bit line BL coupled to a first memory cell 1110, a complementary bit line BLB coupled to a second memory cell 1115, an input/output line IOL, a complementary input/output line IOLB, a bit line sense amplifier 1120, a read column selection circuit 1130, a write column selection circuit 1150, and a data masking control circuit 1160.

The bit line sense amplifier 1120 amplifies a voltage signal of the bit line BL to generate a first amplified signal in response to a first amplifier control voltage SA and a second amplifier control voltage SB. The bit line sense amplifier 1120 provides the first amplified signal to the bit line BL. The bit line sense amplifier 1120 amplifies a voltage signal of the complementary bit line BLB to generate a second amplified signal in response to the first amplifier control voltage SA and the second amplifier control voltage SB. The bit line sense amplifier 1120 provides the second amplified signal to the complementary bit line BLB.

The read column selection circuit 1130 outputs the first amplified signal and the second amplified signal to the input/output line IOL and the complementary input/output line IOLB, respectively, in response to a read column selection signal RCSL. Additionally, the read column selection circuit 1130 electrically separates the bit line pair BL and BLB from the first input line pair IOL and IOLB.

The write column selection circuit 1140 provides signals of the first input/output line pair IOL and IOLB to the bit line pair BL and BLB in response to a write column selection signal WCSL. Additionally, the write column selection circuit 1140 electrically separates the bit line pair BL and BLB from the first input/output line pair IOL and IOLB.

The data masking control circuit 1160 electrically separates the bit line pair BL and BLB from the first input/output line pair IOL and IOLB in response to a first data masking signal DMI.

The first memory cell 1110 coupled to the bit line BL operates in response to a first word line signal WL1. The second memory cell 1115 coupled to the complementary bit line BLB operates in response to a second word line signal WL2.

Figure 10:
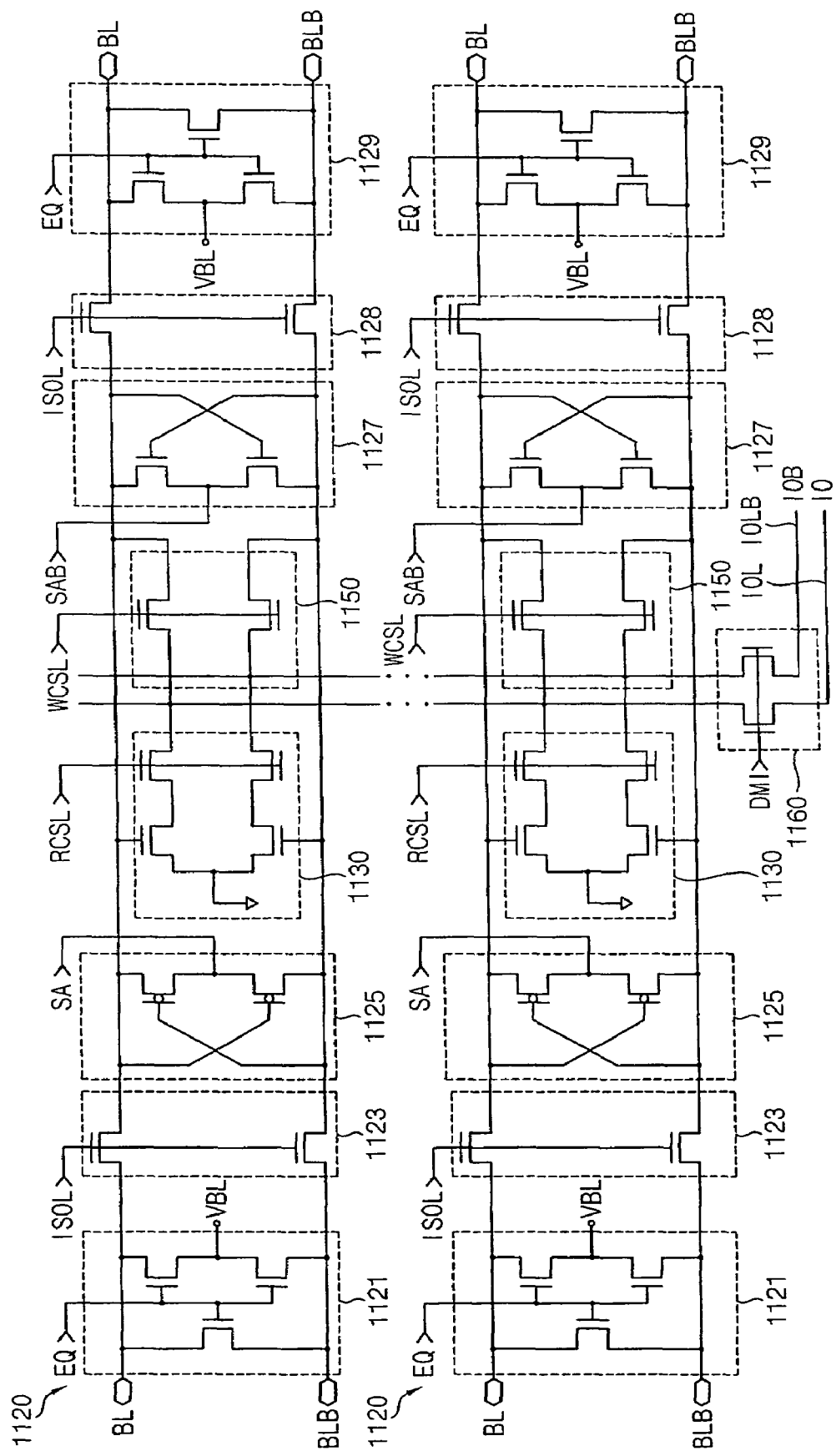
FIG. 10 is a circuit diagram illustrating another example embodiment of respective blocks included in the memory core in FIG. 9.

FIG. 10 is a circuit diagram illustrating an example embodiment of respective blocks included in the memory core in FIG. 9.

One data masking control circuit 1160 can provide a first data masking signal DMI per a predetermined number of memory cell blocks included in the semiconductor memory device in FIGS. 9 and 10.

As mentioned above, in an example embodiment of the present invention, a restoring time of the bit line in the data masking operation mode can be reduced. Thus, a semiconductor device according to an example embodiment can perform a fast data writing operation as a pseudo static random access memory (PSRAM).

While the example embodiments of the present invention and their advantages have been described in detail, it should be understood that various changes, substitutions and alterations can be made herein without departing from the scope of the invention. The invention, therefore, is defined by the broadest interpretation of the claims and their equivalents.

What is claimed is:

1. A semiconductor memory device comprising:
   a memory core configured to amplify a signal from a memory cell to output the amplified signal through an input/output line pair in a read mode, receive a signal of the input/output line pair to be stored in the memory cell in a write mode, and electrically separate a bit line pair from the input/output line pair in response to a read column selection signal, a write column selection signal, and a first data masking signal; and
   an input/output circuit configured to buffer and provide the amplified signal of the input/output line pair to input/output pins, to receive input data from the input/output pins, and to buffer the received input data to provide the buffered input data to the input/output line pair.

2. The semiconductor memory device of claim 1, further comprising:
   a shift control circuit configured to shift bits of a second data masking signal to generate the first data masking signal, and to provide the first data masking signal to the memory core.

3. The semiconductor memory device of claim 1, wherein the shift control circuit is configured to receive the buffered input data and shift bits of the buffered input data to be provided to the memory core.

4. The semiconductor memory device of claim 1, wherein the memory core comprises:
   a bit line and a complementary bit line;
   an input/output line and a complementary input/output line;
   a bit line sense amplifier configured to amplify a voltage signal of the bit line to generate a first amplified signal, and provide the first amplified signal to the bit line, and to amplify a voltage signal of the complementary bit line to generate a second amplified signal, and provide the second amplified signal to the complementary bit line;
   a read column selection circuit configured to output the first amplified signal and the second amplified signal to the input/output line and the complementary input/output line, respectively, in response to the read column selection signal, and to electrically separate the bit line pair from the input/output line pair in response to the read column selection signal; and
   a write column selection circuit configured to provide signals of input/output line pair to the bit line pair in response to the write column selection signal, and to electrically separate the bit line pair from the input/output line pair in response to the write column selection signal and the first data masking signal.

5. The semiconductor memory device of claim 4, wherein the memory core further comprises:
   a first memory cell coupled to the bit line, the first memory cell configured to operate in response to a first word line signal; and
   a second memory cell coupled to the complementary bit line, the second memory cell configured to operate in response to a second word line signal.

6. The semiconductor memory device of claim 4, wherein the read column selection circuit comprises:
   a first metal oxide semiconductor (MOS) transistor having a gate terminal coupled to the bit line and a source terminal coupled to a ground voltage;
   a second MOS transistor having a gate terminal configured to receive the read column selection signal, a source terminal coupled to a drain terminal of the first MOS transistor and a drain terminal coupled to the input/output line;
   a third MOS transistor having a gate terminal coupled to the complementary bit line and a source terminal coupled to the ground voltage; and
   a fourth MOS transistor having a gate terminal configured to receive the read column selection signal, a source terminal coupled to the a drain terminal of the third MOS transistor, and a drain terminal coupled to the complementary input/output line.

7. The semiconductor memory device of claim 4, wherein the write column selection circuit comprises:
   a first MOS transistor having a gate terminal configured to receive the write column selection signal and a source terminal coupled to the input/output line;
   a second MOS transistor having a gate terminal configured to receive the first data masking signal, a source terminal coupled to a drain terminal of the first MOS transistor, and a drain terminal coupled to the bit line;

a third MOS transistor having a gate terminal configured to receive the write column selection signal, and a source terminal coupled to the complementary input/output line; and a fourth MOS transistor having a gate terminal configured to receive the first data masking signal, a source terminal coupled to a drain terminal of the third MOS transistor, and a drain terminal coupled to the complementary bit line.

8. The semiconductor memory device of claim 4, wherein the write column selection circuit comprises:

a first MOS transistor having a gate terminal configured to receive the first data masking signal, and a source terminal coupled to the input/output line;

a second MOS transistor having a gate terminal configured to receive the write column selection signal, a source terminal coupled to a drain terminal of the first MOS transistor, and a drain terminal coupled to the bit line;

a third MOS transistor having a gate terminal configured to receive the first data masking signal, and a source terminal coupled to the complementary input/output line; and a fourth MOS transistor having a gate terminal configured to receive the write column selection signal, a source terminal coupled to a drain terminal of the third MOS transistor, and a drain terminal coupled to the complementary bit line.

9. The semiconductor memory device of claim 1, wherein the memory core comprises:

a bit line and a complementary bit line;

an input/output line and a complementary input/output line;

a bit line sense amplifier configured to amplify a voltage signal of the bit line to generate a first amplified signal, and provide the first amplified signal to the bit line, and configured to amplify a voltage signal of the complementary bit line to generate a second amplified signal, and provide the second amplified signal to the complementary bit line;

a read column selection circuit configured to output the first amplified signal and the second amplified signal to the input/output line and the complementary input/output line, respectively, in response to the read column selection signal, and configured to electrically separate the bit line pair from the input/output line pair in response to the column selection signal;

a write column selection circuit configured to provide signals of input/output line pair to the bit line pair in response to the write column selection signal, and configured to electrically separate the bit line pair from the input/output line pair in response to the write column selection signal; and a data masking control circuit configured to electrically separate the bit line pair from the input/output line pair in response to the first data masking signal.

* * * * *